United States Patent [19]

Kobayashi et al.

[11] Patent Number: 5,227,000
[45] Date of Patent: Jul. 13, 1993

[54] PLASMA ETCHING APPARATUS WITH ACCURATE TEMPERATURE AND VOLTAGE LEVEL CONTROL ON DEVICE UNDER TEST

[75] Inventors: Nobutoshi Kobayashi; Naoki Yoshida, both of Tokyo, Japan

[73] Assignee: Nippon Scientific Co., Ltd., Tokyo, Japan

[21] Appl. No.: 682,618

[22] Filed: Apr. 8, 1991

[30] Foreign Application Priority Data

Apr. 9, 1990 [JP] Japan ................................. 2-92080
Apr. 9, 1990 [JP] Japan ................................. 2-92081

[51] Int. Cl.$^5$ ............................................. H01L 21/00
[52] U.S. Cl. ................................... 156/345; 156/626; 156/643; 118/723; 118/725
[58] Field of Search ............... 156/345, 643, 626, 627; 118/723, 725

[56] References Cited

U.S. PATENT DOCUMENTS

| | | | |
|---|---|---|---|
| 4,341,582 | 7/1982 | Kohman et al. | 156/345 |
| 4,687,319 | 8/1987 | Mishra | 118/61 |
| 4,826,556 | 5/1989 | Kobayashi | 156/345 |
| 4,871,421 | 3/1989 | Ogle et al. | 156/643 |
| 4,891,488 | 1/1990 | Davis et al. | 219/121.4 |
| 4,956,043 | 9/1990 | Kanetomoto et al. | 204/298.32 |

FOREIGN PATENT DOCUMENTS

| | | |
|---|---|---|
| 0320297 | 6/1989 | European Pat. Off. |
| 59-071519 | 4/1984 | Japan. |
| 61-238985 | 10/1986 | Japan. |
| 02072208 | 3/1990 | Japan. |

OTHER PUBLICATIONS

"Perry's Handbook of Chemical Engineering"; ©1973; McGraw-Hill, Inc; pp. 10–3, 10–45, 10–48 to 10–50.
Patent Abstracts of Japan, vol. 11, No. 85 Oct. 1986.

Primary Examiner—Brian E. Hearn
Assistant Examiner—George Goudreau
Attorney, Agent, or Firm—Graham & James

[57] ABSTRACT

A plasma etching apparatus capable of accurately controlling the voltage levels of the pins and the temperature of the device under test in the etching process. The apparatus includes: a radiator, located below the table on which the device under test is placed, for releasing heat from the table; and a thermoelectric cooling element, located between the table and the radiator, for controlling temperature of the device under test on the table. The apparatus may also includes: a detachable adaptor, fixedly mounted on the table, made by an electrically and thermally conductive material, and having at least one trapezoidal ridge with trapezoidal cross section having sloping sides inclined by an angle larger than an angle of the pins of the device under test, for holding the device under test on a top face of the trapezoidal ridge with the pins hanging along the sloping sides; and a detachable holder, fixedly attached to the adaptor over the device under test, and having an opening through which the plasmas are injected onto the device under test, for pressing down the device under test with respect to the adaptor.

6 Claims, 6 Drawing Sheets

PLASMA ETCHING APPARATUS WITH ACCURATE TEMPERATURE AND VOLTAGE LEVEL CONTROL ON DEVICE UNDER TEST

BACKGROUND OF THE INVENTION

1. Field of the Invention

The present invention relates to a plasma etching apparatus for carrying out a manufacturing process of plasma etching.

2. Description of the Background Art

A plastic mold opening device such as that disclosed in Japanese Patent Application Laid Open No. 63-296229 has been known conventionally for opening up a device under test such as an IC chip in order to enable the analysis of malfunctions.

In a case where a further detail analysis of the interior of the IC chip is required, it is necessary to remove the passivation film on a chip surface. By removing the passivation film, it becomes possible to carry out the analysis operation to identify electrically malfunctioning parts by using a probe connected with a curve tracer or an oscilloscope. Also, if it is possible to use an electron microscope, the state of voltage level of each part of the chip can be comprehended without a contact by taking an electron micrograph of the chip in an operating state, so that the malfunctioning parts can easily be identified.

In general the passivation film of the chip is made of a surface layer of silicon nitride ($Si_3N_4$) film and an inner layer of phosphosilicate glass (PSG) film. As a method for removing such a passivation film, a wet method and a dry method have been known conventionally.

In the wet method, the phosphoric acid solution heated up to approximately 180° is used for removing the silicon nitride film, and the buffered hydrofluoric acid (ammonium fluoride solution) at the room temperature is used for removing the phosphosilicate glass film.

In the dry method, the silicon nitride film is removed by the dry etching due to a mixed gas of carbon tetrafluoride ($CF_4$) and oxygen in an isotropic plasma etching apparatus, and the phosphosilicate glass film is removed by the dry etching due to a mixed gas of carbon tetrafluoride ($CF_4$) and hydrogen, or a gas of a compound having a smaller ratio of C and F such as $C_3F_8$ in an anisotropic plasma etching apparatus.

The plasma etching apparatus used in the dry method has a table provided on a base, which functions as an electrode, and on which a device under test such as an IC chip to be applied with the etching process is placed, and a freely openable chamber lid having another electrode to cover the device under test from above is provided over the table. In this plasma etching apparatus, the etching process can be applied to the device under test by supplying a gas to the discharge chamber formed by the table and the chamber lid in a state in which the chamber lid is closed and the device under test is placed between two electrodes, and by causing the plasma generation between two electrodes.

Now, in such a conventional plasma etching apparatus, although the device under test is fixed on the table, the pins of the IC chip in mutually insulated state can lead to the damaging of the IC chip during the etching process due to the differences among the voltage levels produced on the pins, so that it is necessary to maintain the pins at the same voltage level. Conventionally, this has been achieved by providing holes or grooves with constant interval in correspondence with the pins such that the pins can be fitted into the holes or grooves in order to prevent the generation of the voltage level differences.

On the other hand, in order to prevent the deterioration of the reproduction capability of the IC chip due to the variations of the etching processed parts on the device under test caused by the temperature increase during the repeated application of the etching operations in the etching process, it is necessary to control the temperature of the device under test during the etching process. Conventionally, this has been achieved by providing a cooler below the table from which the cooled water is circulated around the table in order to control the temperature of the device under test. However, this method makes the size of the apparatus very large and the cost of the apparatus very expensive. Also, in order to circulate the cooled water, the piping around the table is required, but such a piping interfered with the operations to be performed around the table.

SUMMARY OF THE INVENTION

It is therefore an object of the present invention to provide a plasma etching apparatus capable of controlling the voltage levels of the pins of the device under test and the temperature of the device under test during the repeated application of the etching operations in the etching process, without increasing the size and cost of the apparatus very much.

According to one aspect of the present invention there is provided a plasma etching apparatus, comprising: a table functioning as a first electrode, connected with a high frequency voltage source, and on which a device under test is placed; a chamber lid having a second electrode connected with the high frequency voltage source, which closes over the table to form a discharge chamber in which plasmas for performing etching operations on the device under test are generated between the first and second electrodes; radiator means located below the table for releasing heat from the table; and thermoelectric cooling element means located between the table and the radiator means for controlling temperature of the device under test on the table.

According to another aspect of the present invention there is provided a plasma etching apparatus, comprising: a table functioning as a first electrode, connected with a high frequency voltage source, and on which a device under test having a plurality of pins is placed; a chamber lid having a second electrode, which closes over the table to form a discharge chamber in which plasmas for performing etching operations on the device under test are generated between the first and second electrodes; detachable adaptor means, fixedly mounted on the table, made by an electrically and thermally conductive material, and having at least one trapezoidal ridge with trapezoidal cross section having sloping sides inclined by an angle larger than an angle of the pins of the device under test, for holding the device under test on a top face of the trapezoidal ridge with the pins hanging along the sloping sides; and detachable holder means, fixedly attached to the adaptor means over the device under test, and having an opening through which the plasmas are injected onto the device under test, for pressing down the device under test with respect to the adaptor means.

Other features and advantages of the present invention will become apparent from the following description taken in conjunction with the accompanying drawings.

DETAILED DESCRIPTION OF THE PREFERRED EMBODIMENTS

Figure 1:
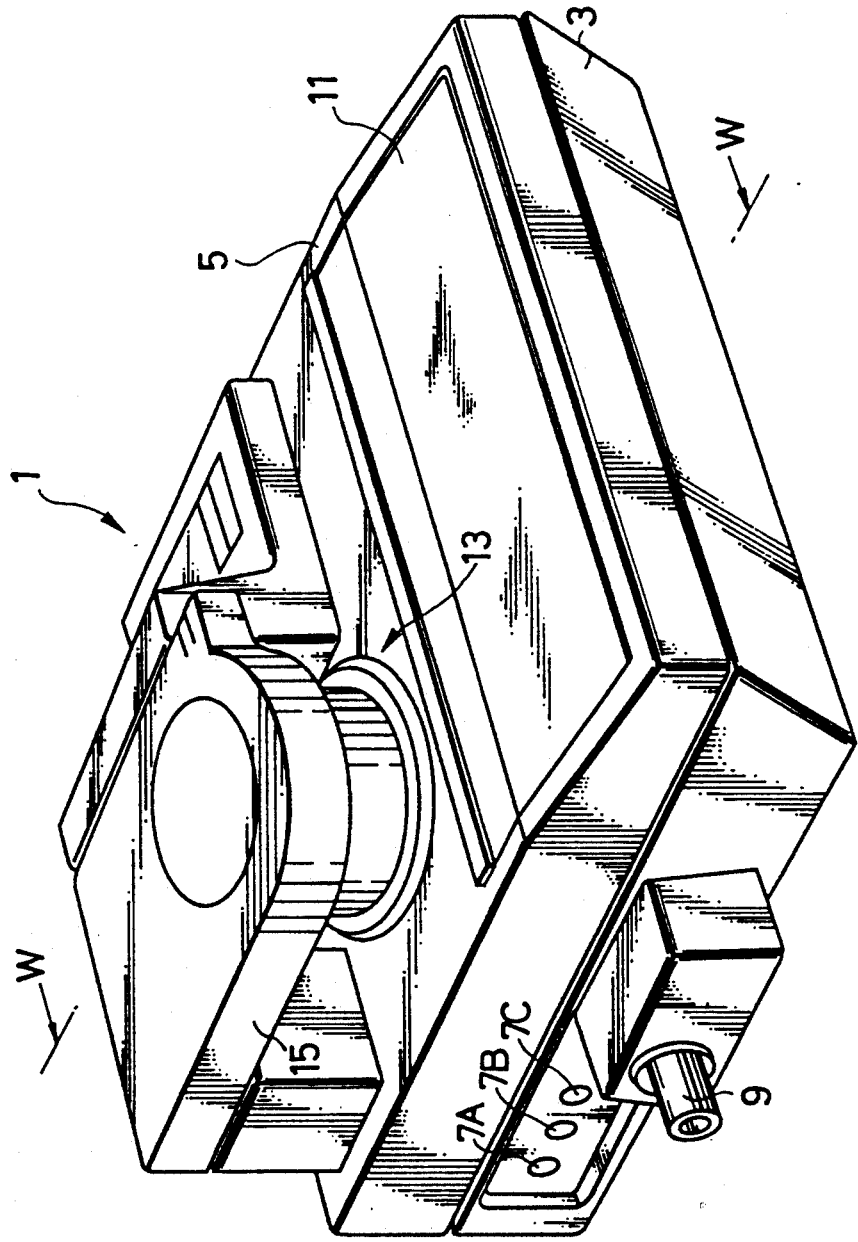
FIG. 1 is a perspective view of one embodiment of the plasma etching apparatus according to the present invention.
Figure 2:
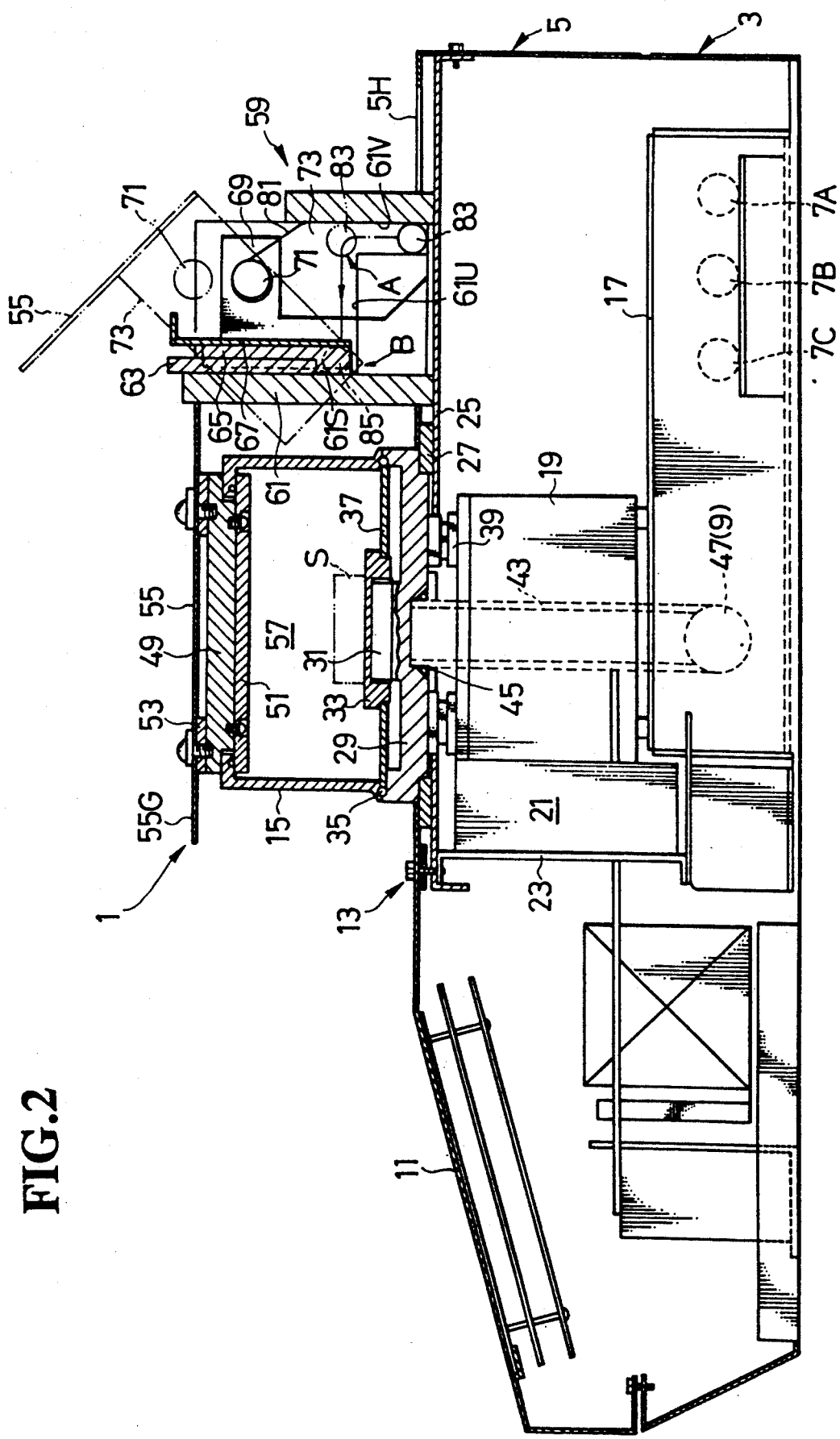
FIG. 2 is a cross sectional view of the plasma etching apparatus of FIG. 1.
Figure 3:
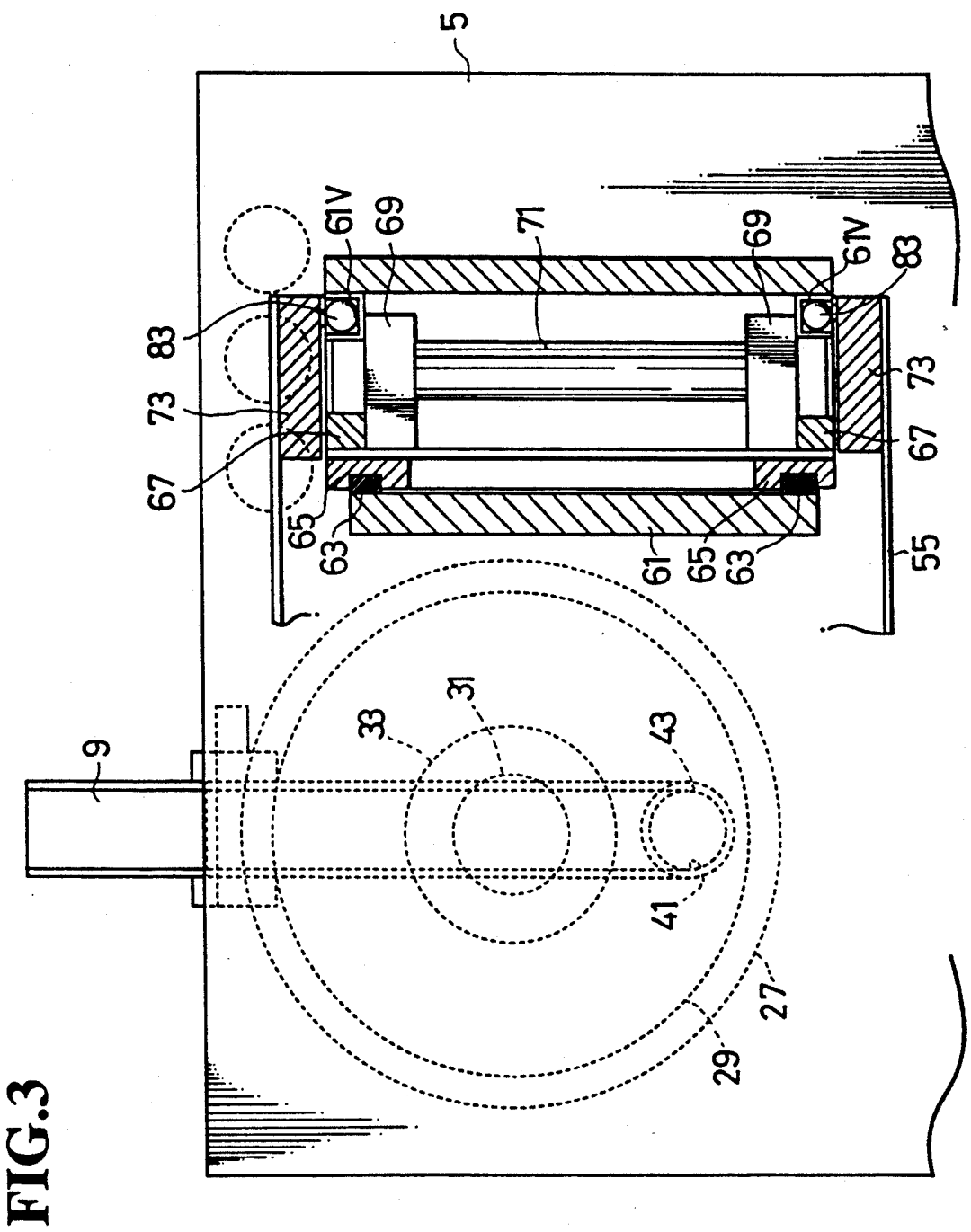
FIG. 3 is a top plan view of a main portion of the plasma etching apparatus of FIG. 1.

Referring now to FIG. 1 to FIG. 3, one embodiment of a plasma etching apparatus according to the present invention will be described in detail.

As shown in FIG. 1, this plasma etching apparatus 1 is adapted to be placed on a measurement table (not shown) and generally comprises a lower base 3 in a shape of a box without a top, and an upper base 5 in a shape of a box without a bottom, which are fixed together by bolts.

On a rear portion of a left side wall of the lower base 3, there are provided three gas supply inlets 7A, 7B, and 7C for supplying three different types of gases among $CF_4$, $O_2$, $H_2$, and $N_2$ from gas pipes (not shown) connected to gas bottles (not shown). Also, on a middle portion of the left side wall of the lower base 3, there is provided a vacuum inlet 9 to be connected with a vacuum pump (not shown) through a vacuum pipe (not shown).

On a front portion of the upper base 5, there is provided a control panel 11 including various indicators and switches for controlling the operation of the apparatus 1. Also, on a middle portion of the upper base 5, there is provided an etching process unit 13 in which the etching operations are carried out, and over this etching process unit 13 a freely openable chamber lid 15 is closed.

A further detailed configuration of this plasma etching apparatus 1 is shown in FIG. 2 which is a cross sectional view of the apparatus 1 at W—W plane shown in FIG. 1.

Namely, the upper base 5 has a hole 5H on its top, while on a bottom face of the lower base 3 there is provided a box shaped support frame 17. Also, on top of this support frame 17 there is provided a radiator 19, and on a front (left in FIG. 2) side of this radiator 19 there is provided a fan 21.

Moreover, on the front side of this fan 21 there is provided a vertical channel 23, and on top of this channel 23 there is provided a horizontal channel 25 having an opening on top, where the front end of the horizontal channel 25 is attached to an upper face of the upper base 5 while the rear end of the horizontal channel 25 is attached to a rear wall of the upper base 5.

Furthermore, a ring shaped insert member 27 is inserted between the horizontal channel 25 and the upper face of the upper base 5, and on an inner edge of this ring shaped insert member 27 a disk shaped support base 29 is attached. A central axis of this support base 29 is integrally connected with a cylindrical table support member 31 extending above into a circular table 33.

The outer circumference of the table support member 31 is formed in a shape of a male thread which is engaged into a female thread provided on an inner circumference of the table 33 such that the table 33 is fixed to the table support member 31. The table 33 is to function as a first electrode in the etching process, and is supported by a support ring 37 which is attached on the support base 29 with a seal member 35.

Between the radiator 19 and the support base 29, there is also provided a thermoelectric cooling element 39 containing a plurality of Peltier elements.

Also, as shown in FIG. 3, on a right (below in FIG. 3) side of an axis of the support base 29 there is provided a hole 41 which is connected to a top end of a vertically extended pipe 43 with a seal member 45, while a bottom end of the pipe 43 is connected to the vacuum inlet 9 through a pipe 47.

The chamber lid 15 is a transparent cylindrical member formed by quartz glass, on top of which a disk shaped member 49 is attached. On a lower face of the disk shaped member 49 a circular electrode member 51 to function as a second electrode is attached by a plurality of bolts. On an upper face of the disk shaped member 49 a plate member 55 extending in a front and rear directions is attached through a ring member 53.

In this configuration, a discharge chamber 57 is formed by a space enclosed by the chamber lid 15, support ring 37, and table 33 when the chamber lid 15 is completely closed such that the bottom edge of the chamber lid 15 is in contact with the support base 29 as shown in FIG. 2. When the necessary gases are supplied from the gas supply inlets 7A, 7B, and 7C, the supplied gases fill up this discharge chamber 57. On the other hand, when the vacuum pump (not shown) is activated, the active gases filling up the discharge chamber 57 can be evacuated through the hole 41 on the support base 29, pipes 43 and 47, and vacuum inlet 9.

The device under test S such as an IC chip is to be placed inside the discharge chamber 57 on the table 33, as shown in FIG. 2.

The table 33 as the first electrode and the electrode member 51 as the second electrode are also connected to a high frequency voltage source (not shown) such that when this high frequency voltage source is turned on, the plasmas can be generated between the table 33 and the electrode member 51.

Then, the gases filling up the discharge chamber 57 are oscillated by the generated high frequency plasmas until they are ionized and turned into plasmas. In the plasmas, the active gases which contribute to the etching process are generated, such that the passivation film of the device under test S on the table 33 is removed as a result of chemical reactions caused by the active gases radiating onto the device under test S, so as to realize the etching process.

As shown in FIG. 2 and FIG. 3, on the rear portion of the upper face of the upper base 5, there is also provided a driving unit 59 for moving the chamber lid 15 up and down and rotating the chamber lid 15. This driving unit 59 includes a driving base 61 attached on the horizontal channel 25 through the hole 5H on the upper face of the upper base 5. On the rear side of the driving base 61 a parallel pair of vertical guide members 63 are provided, and a vertically slidable slide member 67 is attached to the guide members 63 through slide bearings 65. The slide member 67 is integrally connected with support blocks 69, and between the support blocks 69 a rotation axis 71 is attached while on both ends of the rotation axis 71 movable blocks 73 are attached to be freely rotatable. Also, the rotation axis 71 has springs 81 wound around, where one ends of the springs 81 are fixed to the movable blocks 73 while the other ends of the springs 81 are fixed to the support blocks 69.

The rear end of the plate 55 is attached to the movable blocks 73 by a plurality of bolts, and on a groove 61V formed on the rear part of the driving base 61 there is provided a guide roller 83 for guiding in the horizontal and vertical directions.

In this configuration, when an handle 55G attached to a front end of the plate 55 is lifted upwards, the slide member 67 is slightly lifted along the guide members 63. Then, the movable blocks 73 are also lifted through the support blocks 69 supported by the slide member 67, and the rotation axis 71 is lifted up to a position indicated by a double dotted chain line in FIG. 2.

While the movable blocks 73 are lifted up to the position indicated by the double dotted chain line, the guide roller 83 provided in the groove 61V of the driving base 61 is also lifted up to a position A shown in FIG. 2 where the guide roller 83 is freed from the groove 61V, such that the movable blocks 73 are put in a rotatable state. Here, the guide roller 83 suppresses the movement in the horizontal direction, while the movable blocks 73 makes the upward movement smooth.

Moreover, when the plate 55 is lifted further upwards, the rotation axis 71 located at the position of the double dotted chain line starts to rotate, and the plate 55 is lifted up to the position of the double dotted chain line as the movable blocks 73 rotate to the position of the double dotted chain line before it comes to stop, such that the chamber lid 15 can be freed from the support base 29. Then, the already etching processed device under test S on the table 33 can be removed from the table 33, and the new device under test can placed on the table 33.

Here, in rotating the movable blocks 73, the guide roller 83 rolls over the upper face 61U of the driving base 61 from the position A to the position B smoothly, until it hits the side face 61S of the driving base 61 such that the rotation of the movable blocks 73 is stopped.

The springs 81 hold the movable blocks 73 at the position of the double dotted chain line.

In closing the chamber lid 15 over the support base 29, the handle 55G of the plate 55 is lowered downward from the position of the double dotted chain line, to carry out the action exactly opposite of that described above for a case of opening the chamber lid 15. When the chamber lid 15 is closed over the support base 29, the bottom edge of the chamber lid 15 is put in tight contact with the seal member 35 provided between the support base 29 and the support ring 37 due to the weight of the chamber lid 15, such that the leakage of the air from the discharge chamber 57 can be prevented. Here, the chamber lid 15 becomes parallel to the table 33 in the closed position such that the uniform contact can be made around the bottom edge of the chamber lid 15.

Moreover, in this configuration, the apparatus 1 can be formed in a compact size without the chamber lid 15 interfering with the device under test S on the table 33.

Figure 4:
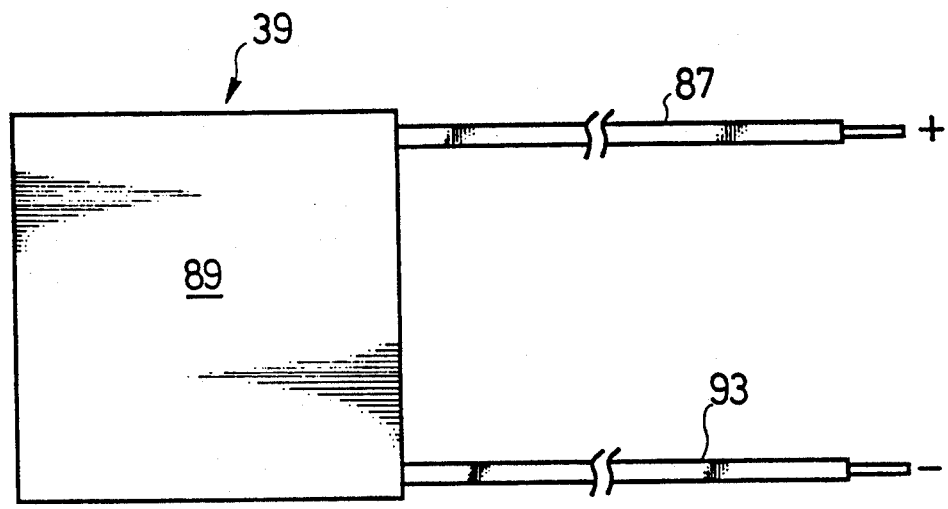
FIG. 4 is a top plan view of a thermoelectric cooling element in the plasma etching apparatus of FIG. 1.
Figure 5:
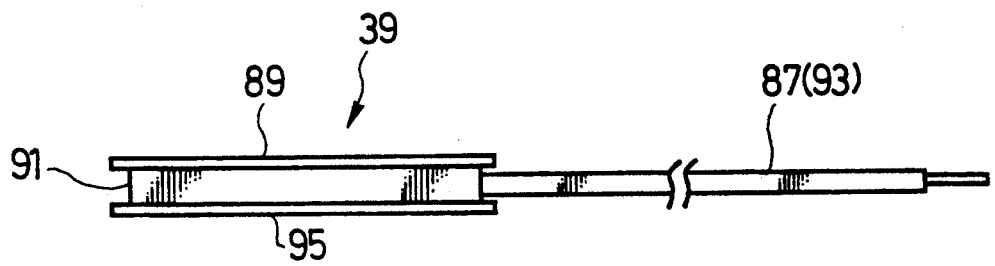
FIG. 5 is a side view of the thermoplastic cooling element of FIG. 4 in the plasma etching apparatus of FIG. 1.

The thermoelectric cooling element 39 containing a plurality of Peltier elements located between the support base 29 and the radiator 19 has a detail configuration shown in FIGS. 4 and 5 which comprises a middle electrode 91 sandwiched between an n-type semiconductor body 89 connected to a positive electrode 87 and a p-type semiconductor body 95 connected to a negative electrode 93.

In this configuration, when the voltage is applied between the positive electrode 87 and the negative electrode 93, this thermoelectric cooling element 39 starts to function as a heat pump formed by the n-type semiconductor body 89 and the p-type semiconductor body 95 as exothermic elements and the middle electrode 91 as an endothermic element, such that the device under test S is cooled through the support base 29, table support member 31, and table 33 in which case the heat is released by the radiator 19.

On the other hand, when the voltage applied between the positive electrode 87 and the negative electrode 93 is reversed, the device under test S is heated up.

Thus, by appropriately controlling the voltage applied between the positive electrode 87 and the negative electrode 93, the temperature of the device under test S can be maintained to be substantially constant during the repeated etching operations by this thermoelectric cooling element 39, such that the uniform etching process without variations among the etching processed parts can be applied to the device under test S.

Moreover, the thermoelectric cooling element 39 itself can be provided between the table 33 and the radiator 19, so that this cooling mechanism can be made in a compact size and at a low cost.

Figure 6:
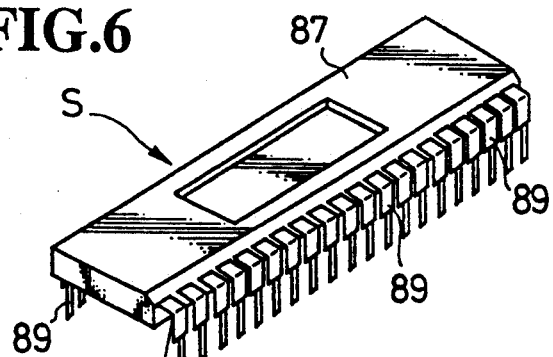
FIG. 6 is a perspective view of an example of an IC chip to be used as a device under test in the plasma etching apparatus of FIG. 1.

The device under test S to which the etching process is to be applied by this plasma etching apparatus is most typically an IC chip such as that shown in FIG. 6. This IC chip package of FIG. 6 comprises an IC frame 87 and a plurality of pins 89 arranged at constant intervals on two sides of the IC frame 87 with an angle $\alpha$ with respect to the IC frame 87.

Figure 7:
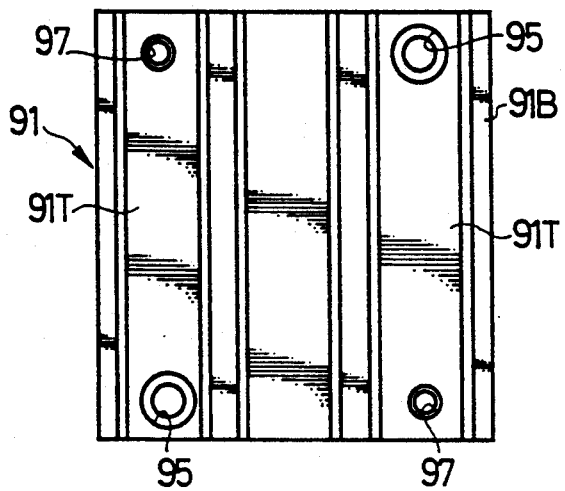
FIG. 7 is a top plan view of an adaptor in the plasma etching apparatus of FIG. 1.
Figure 8:
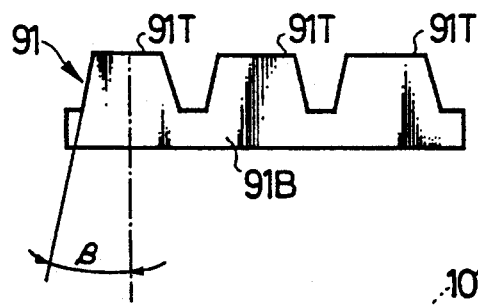
FIG. 8 is a side view of the adaptor of FIG. 7 in the plasma etching apparatus of FIG. 1.

This device under test S in a form of an IC chip is fixedly held on the table 33 by using an adaptor 91 shown in FIGS. 7 and 8 and a holder 93 shown in FIG. 4.

The adaptor 91 is made by an electrically and thermally conductive material and comprises a base portion 91B and a number of trapezoidal ridges 91T each of which having a trapezoidal cross section with sloping sides inclined by an angle $\beta$ and which are arranged on the base portion 91B. Here, the angle $\beta$ is made to be larger than the angle $\alpha$ of the pins 89 with respect to the IC frame 87 in the device under test S ($\beta > \alpha$). Also, holes 95 and 97 are formed on the top faces of the trapezoidal ridges 91T located at the four corners of the adaptor 91 as shown in FIG. 7.

The holder 93 comprises a flat plate 99 having a rectangular opening 101 in a middle and holes 103 on corners corresponding to the holes 97 of the adaptor 91.

Figure 10:
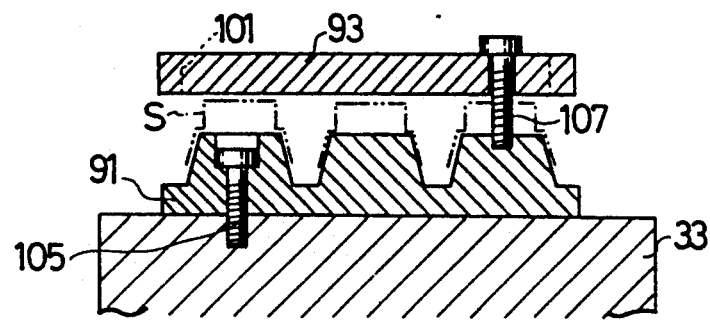
FIG. 10 is a side view of the adaptor of FIGS. 7 and 8 and the holder of FIG. 9 in a state of fixedly holding a device under test on a table in the plasma etching apparatus of FIG. 1.

In fixedly holding the device under test S on the table 33 as shown in FIG. 10, first the adaptor 91 is mounted on the table 33 and bolts 105 are inserted into the holes 95 so as to fix the adaptor 91 to the table 33.

Then, the test bodies S in forms of the IC chips are placed on the trapezoidal ridges 91T with a bottom face of the IC frame 87 of each device under test S lying on the top face of each trapezoidal ridge 91T and the pins 89 hanging along the sloping sides of the trapezoidal ridges 91T. Here, because the angle $\beta$ of the sloping sides of the trapezoidal ridges 91T is larger than the angle $\alpha$ of the pins 89 of the device under test S, when the bolts 107 are tightened such that the holder 93 presses the test bodies S down, all the pins 89 make tight and uniform contacts with the sloping sides of the trapezoidal ridges 91T, even when the angles of the pins 89 are not exactly the same for all the pins 89.

Then, the holder 93 is placed over the test bodies S, and bolts 107 are inserted into the holes 97 on the adaptor 91 through the holes 103 on the holder 93 so as to fix the holder 93 to the adaptor 91, such that in effect the test bodies S can be fixedly held on the table 33.

Here, because the adaptor 91 is made of electrically and thermally conductive material, the pins 89 making tight and uniform contacts with the trapezoidal ridges 91T of the adaptor 91 can be maintained at the same voltage level and the uniform temperature control can be realized, so that the improved etching process result can be ensured.

The plasmas for removing the passivation film of the device under test S which are generated by the active gases in the discharge chamber 57 are injected onto the device under test S through the rectangular opening 101 on the holder 93.

Figure 9:
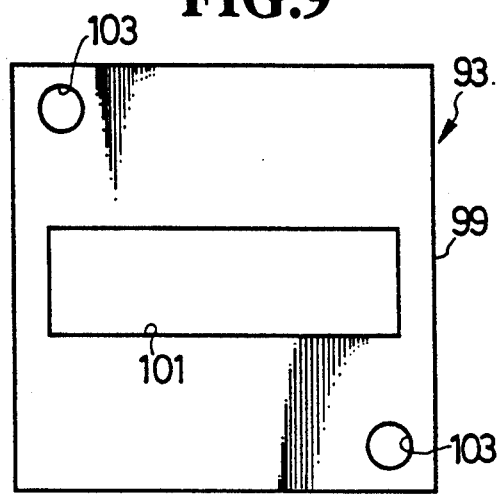
FIG. 9 is a top plan view of a holder in the plasma etching apparatus of FIG. 1.
Figure 11:
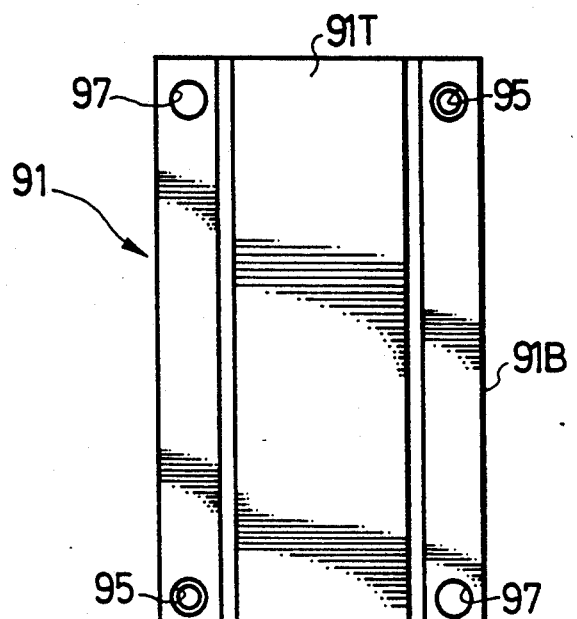
FIG. 11 is a top plan view of an alternative form of an adaptor in the plasma etching apparatus of FIG. 1.
Figure 12:
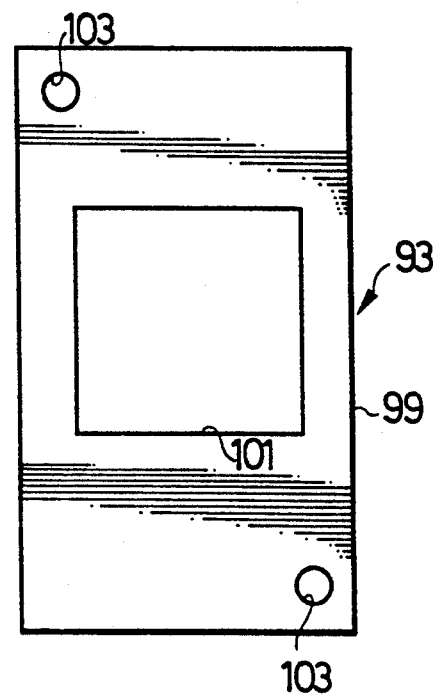
FIG. 12 is a side view of the alternative form of the adaptor of FIG. 7 in the plasma etching apparatus of FIG. 1.
Figure 13:
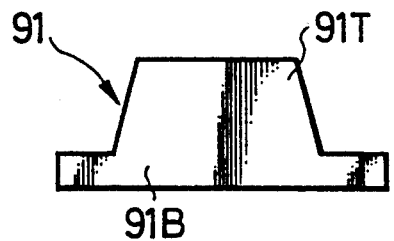
FIG. 13 is a top plan view of an alternative form of a holder in the plasma etching apparatus of FIG. 1.

Instead of the adaptor 91 of FIGS. 7 and 8 and the holder 93 of FIG. 9, the adaptor 91 shown in FIGS. 11 and 12 and the holder 93 shown in FIG. 13 may be used. The adaptor 91 of FIGS. 11 and 12 differs from that of FIGS. 7 and 8 in that it incorporates only one trapezoidal ridge 91T such that it is suitable for a large size IC chip, while the holder 93 of FIG. 13 differs from that of FIG. 9 in that its rectangular opening 101 is square shaped in correspondence to the single trapezoidal ridge 91T of the adaptor 91 of FIGS. 11 and 12. The operation of the adaptor 91 of FIGS. 11 and 12 and the holder 93 of FIG. 13 is exactly the same as that described above for the adaptor 91 of FIGS. 7 and 8 and the holder 93 of FIG. 9.

It is to be noted that many modifications and variations of the above embodiments may be made without departing from the novel and advantageous features of the present invention. Accordingly, all such modifications and variations are intended to be included within the scope of the appended claims.

What is claimed is:

1. A plasma etching apparatus, comprising:
    a table functioning as a first electrode, connected with a high frequency voltage source, and on which a device under test having a plurality of pins is placed;
    a chamber lid having a second electrode, which closes over the table to form a discharge chamber in which plasmas for performing etching operations on the device under test are generated between the first and second electrodes;
    detachable adaptor means, fixedly mounted on the table, made by an electrically and thermally conductive material, and having at least one trapezoidal ridge with trapezoidal cross section having sloping sides inclined by an angle larger than an angle of the pins of the device under test, for holding the device under test on a top face of the trapezoidal ridge with the pins hanging along the sloping sides; and
    detachable holder means, fixedly attached to the adaptor means over the device under test, and having an opening through which the plasmas are injected onto the device under test, for pressing down the device under test with respect to the adaptor means.

2. The plasma etching apparatus of claim 1, wherein the holder means presses the device under test such that all the pins make tight and uniform contacts with the sloping sides of the trapezoidal ridge.

3. The plasma etching apparatus of claim 1, further comprising: radiator means located below the table for releasing heat from the table; and thermoelectric cooling element means located between the table and the radiator means for controlling temperature of the device under test on the table.

4. The plasma etching apparatus of claim 3, wherein the thermoelectric cooling element means includes at least one Peltier element functioning as a heat pump and comprising: an n-type semiconductor body connected to a positive electrode; a p-type semiconductor body connected to a negative electrode; and a middle electrode sandwiched between the n-type semiconductor body and the p-type semiconductor body.

5. The plasma etching apparatus of claim 4, wherein the positive electrode and the negative electrode are applied with a voltage in a normal direction for cooling down the device under test, and a voltage in a reversed direction for heating up the device under test.

6. The plasma etching apparatus of claim 3, wherein the holder means presses the device under test such that all the pins make tight and uniform contacts with the sloping sides of the trapezoidal ridge.

* * * * *